(12) United States Patent
Kuo

(10) Patent No.: US 8,809,677 B1
(45) Date of Patent: Aug. 19, 2014

(54) MOLDED LIGHT GUIDE FOR CONCENTRATED PHOTOVOLTAIC RECEIVER MODULE

(75) Inventor: Bob Shih-Wei Kuo, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 376 days.

(21) Appl. No.: 12/830,138

(22) Filed: Jul. 2, 2010

(51) Int. Cl.
*H01L 31/042* (2014.01)
*G02B 5/10* (2006.01)
*G02B 5/09* (2006.01)

(52) U.S. Cl.
USPC .......................... 136/259; 136/246

(58) Field of Classification Search
CPC .. Y02E 10/52; G02B 19/0019; G02B 6/0055; G02B 5/02; G02B 6/0065; G02B 6/0073; G02B 19/0042; G02B 6/0018; G02B 6/0031; H01L 31/02327; H01L 31/0522; H01L 31/0525; H01L 31/0524; H01L 31/0422
USPC .................................. 136/259, 246
See application file for complete search history.

(56) References Cited

U.S. PATENT DOCUMENTS

| | | | |
|---|---|---|---|
| 5,622,873 A | 4/1997 | Kim et al. | |
| 6,005,287 A | 12/1999 | Kaiya et al. | |
| 6,040,626 A | 3/2000 | Cheah | |
| 6,043,425 A * | 3/2000 | Assad | 136/246 |
| 6,650,004 B1 | 11/2003 | Horie | |
| 6,794,740 B1 | 9/2004 | Edwards | |
| 6,815,244 B2 | 11/2004 | Böttner et al. | |
| 6,844,615 B1 | 1/2005 | Edwards | |
| 7,002,241 B1 | 2/2006 | Mostafazadeh | |
| 2003/0075213 A1 | 4/2003 | Chen | |
| 2005/0051205 A1 | 3/2005 | Mook | |
| 2006/0072222 A1 * | 4/2006 | Lichy | 359/853 |
| 2006/0266408 A1 * | 11/2006 | Horne et al. | 136/246 |
| 2007/0256726 A1 * | 11/2007 | Fork et al. | 136/246 |
| 2008/0048102 A1 * | 2/2008 | Kurtz et al. | 250/226 |
| 2008/0083450 A1 * | 4/2008 | Benoit et al. | 136/246 |
| 2008/0308154 A1 * | 12/2008 | Cart et al. | 136/259 |
| 2009/0114265 A1 * | 5/2009 | Milbourne et al. | 136/246 |
| 2010/0229920 A1 * | 9/2010 | Hong et al. | 136/246 |
| 2010/0258170 A1 * | 10/2010 | Kornfield et al. | 136/255 |

OTHER PUBLICATIONS

Oates, T.W.H, et al., J. Phys. Chem. C., 2009, 113, 9588-9594.*

* cited by examiner

*Primary Examiner* — Miriam Berdichevsky
*Assistant Examiner* — Sadie White
(74) *Attorney, Agent, or Firm* — Kevin B. Jackson

(57) ABSTRACT

In accordance with the present invention, there is provided multiple embodiments of a concentrated photovoltaic (CPV) module. In each embodiment of the present invention, the CPV module includes a light guide having a molded, cast or machined hollow funnel with a highly reflective internal surface for use in guiding focused solar rays to the active, front surface of the receiver die of the CPV module.

16 Claims, 3 Drawing Sheets

MOLDED LIGHT GUIDE FOR CONCENTRATED PHOTOVOLTAIC RECEIVER MODULE

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Technical Field of the Invention

The present invention relates generally to semiconductor devices and, more particularly, to a concentrated photovoltaic (CPV) receiver module or solar cell assembly which includes a molded, cast or machined hollow funnel having a highly reflective internal surface for use in guiding focused solar rays to the receiver die surface of the receiver die of the module or assembly.

2. Description of the Related Art

Photovoltaic cells are a well known means for producing electrical current from electromagnetic radiation. Traditional photovoltaic cells comprise junction diodes fabricated from appropriately doped semiconductor materials. Such devices are typically fabricated as thin, flat wafers with the junction formed parallel to and near one of the flat surfaces. Photovoltaic cells are intended to be illuminated through their so-called "front" surface. Electromagnetic radiation absorbed by the semiconductor produces electron-hole pairs in the semiconductor. These electron-hole pairs may be separated by the electric field of the junction, thereby producing a photocurrent. Currently known photovoltaic cells typically have a generally quadrangular (e.g., square) configuration defining four peripheral side edges, and include a pair of bus bars which are disposed on the top or front surface and extend along respective ones of an opposed pair of the side edges. The bus bars are used to facilitate the electrical connection of the photovoltaic cell to another structure, as described in more detail below.

There is currently known in the electrical arts semiconductor devices known as CPV receiver die packages or modules. Currently known CPV modules typically comprise a ceramic substrate having a conductive pattern disposed on one side or face thereof. Attached to the substrate and electrically connected to the conductive pattern are electrical components, including a pair of preformed wire connectors and a packaged diode. Also attached to the substrate and electrically connected to the conductive pattern thereof is a CPV receiver cell or die. The electrical connection between the receiver die and the conductive pattern is often facilitated by a pair of punched thin metal foil or braided ribbon/mesh connectors which extend along and are welded or soldered to respective ones of opposed sides of the receiver die, which typically has a quadrangular or square configuration as indicated above. More particularly, the pair of punched thin metal foils or braided ribbon/mesh connectors are welded or soldered to respective ones of the bus bars on the top or front surface of the receiver die. In certain existing CPV modules, the electrical connection of the receiver die to the conductive pattern is facilitated by the use of multiple wires bonded to the bus bars on the front surface of the receiver die and the bond pads of the conductive pattern of the substrate, the wires being used as an alternative to the aforementioned braided ribbon or mesh interconnects. When wires are used as an alternative to the ribbon/mesh type interconnects, such wires require encapsulation, over-molding or other protection from the environment for long-term reliability of the CPV module including the same.

The CPV module may further include a light concentration means or optical light guide which is adapted to concentrate solar radiation onto the front surface of the receiver die. In this regard, CPV modules typically include a polished glass prism which is operatively connected to the solar cell or receiver die, and is used to guide the focused solar rays to the front surface of the receiver die. The prism also prevents light leak or mis-focused solar energy that may otherwise cause damage to the structures around the receiver die.

However, a drawback in the design of current CPV modules is that the aforementioned prisms require a special optical adhesive to attach the bottom surface thereof to the receiver die. The attachment of the prism to the receiver die also presents a myriad of problems in relation to the assembly of the CPV module. These problems include difficulties in automating the pick-up and placement of the prism, the susceptibility of the prism to cracking, chipping, or other contamination, the susceptibility of trapped air bubbles being present in the optical adhesive used to attach the prism to the receiver die, the delamination of the optical adhesive during transport or use of the CPV module, light loss through interface reflection or internal absorption, and optical adhesive "creep" on the sides of the prism that causes light coupling loss. In addition, the natural shape of a focus spot from currently known concentrating optics (e.g., prisms) is circular, whereas the front surface of the receiver die is normally square, thus creating a mismatch in geometry. Typically, such mismatch is accommodated by either truncating the focus spot on the entering surface of the prism which has the detrimental effect of introducing additional light loss, or oversizing the prism which has the detrimental effect of adding weight and cost. Still further, currently known glass prisms are heavy in weight and expensive to manufacture.

The present invention addresses these and other shortcomings of prior art CPV modules by using a molded, cast or machined funnel fabricated from a highly reflective material or plated with a reflective film to guide focused solar rays onto the front surface of the receiver die or cell of a CPV module. These, and other features of the present invention will be described in more detail below.

BRIEF DESCRIPTION OF THE DRAWINGS

These, as well as other features of the present invention, will become more apparent upon reference to the drawings wherein.

DETAILED DESCRIPTION OF THE INVENTION

Figure 1:
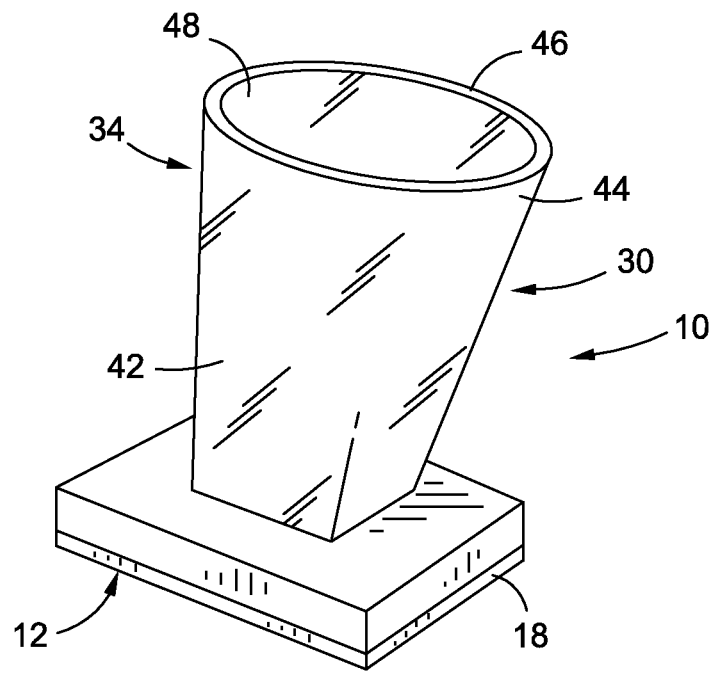
FIG. 1 is a top perspective view of a CPV module constructed in accordance with a first embodiment of the present invention.

Common reference numerals are used throughout the drawings and detailed description to indicate like elements.

Figure 2:
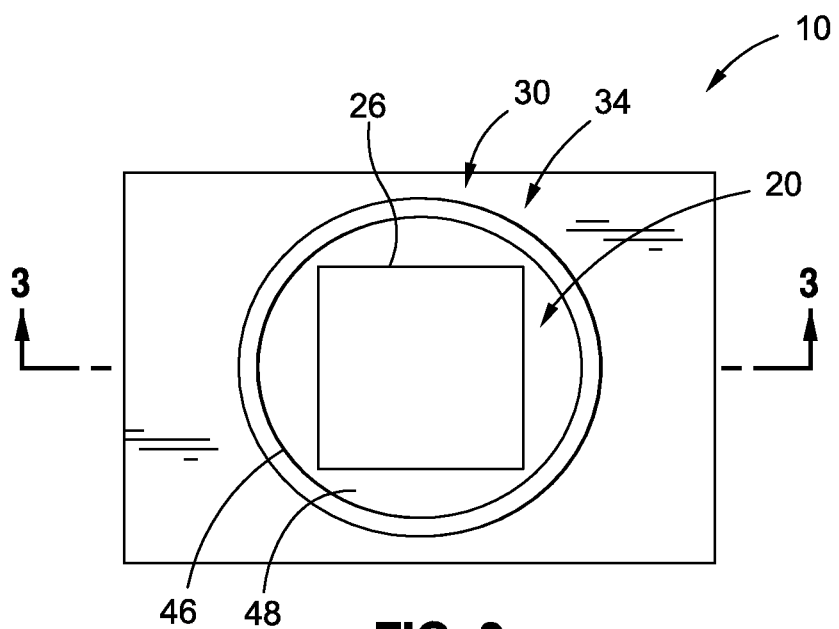
FIG. 2 is a top plan view of the CPV module shown in FIG. 1.
Figure 3:
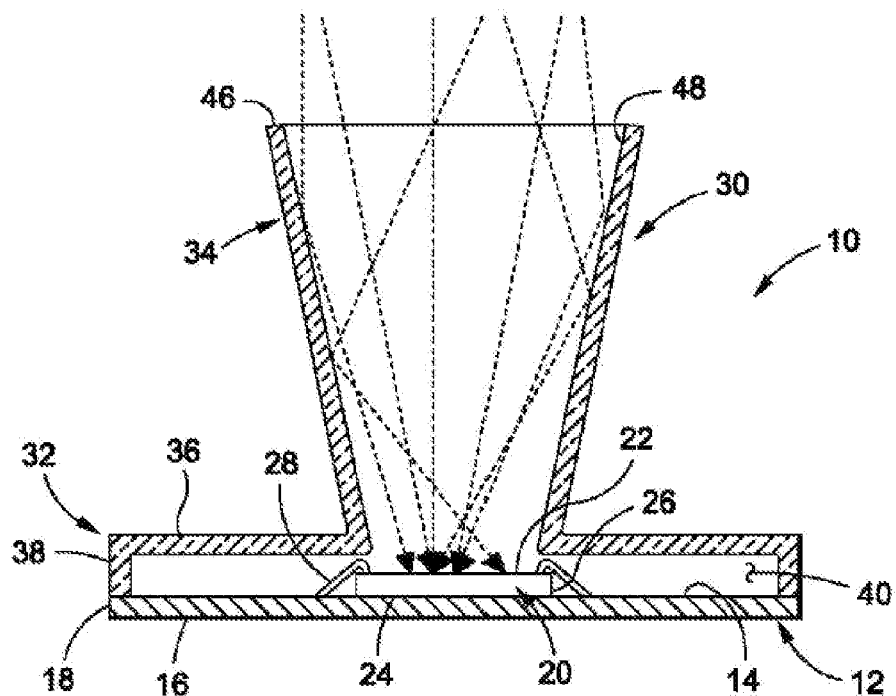
FIG. 3 is a cross-sectional view of the receiver die shown in FIG. 2 taken along line 3-3 thereof.

Referring now to the drawings wherein the showings are for purposes of illustrating preferred embodiments of the present invention only, and not for purposes of limiting the same, FIGS. 1-3 depict a CPV module 10 constructed in accordance with a first embodiment of the present invention. The CPV module 10 comprises a substrate 12 which preferably has a generally quadrangular (e.g., square) configuration. When viewed from the perspective shown in FIG. 3, the substrate 12 defines a generally planar first (top) surface 14 and an opposed, generally planar second (bottom) surface 16. The substrate 12 further defines a peripheral side surface 18 which extends generally perpendicularly between the first and second surfaces 14, 16, and includes four generally linear peripheral side surface segments. Though not shown in FIG. 3, the substrate 12 also includes a conductive pattern which is disposed on the first surface 14 thereof.

Attached to the substrate 12 and electrically connected to the conductive pattern thereof is a CPV receiver cell or die 20. The receiver die 20 has a generally quadrangular (e.g., square) configuration, and defines a generally planar front or top surface 22 and an opposed, generally planar bottom or back surface 24. In addition, the receiver die 20 defines a peripheral side surface 26 which extends between the front and back surfaces 22, 24 thereof and also includes four generally linear peripheral side surface segments. In the CPV module 10, the back surface 24 of the receiver die 20 is attached to the first surface 14 of the substrate 12. Disposed on the first surface 22 of the receiver die 20 and extending along respective ones of an opposed pair of peripheral edge segments defined thereby is a spaced, generally parallel pair of elongated bus bars. As shown in FIG. 3, the receiver die 20 is electrically connected to the conductive pattern disposed on the first surface 14 of the substrate 12 by multiple wires 28 which are bonded to respective ones of the bus bars on the front surface 22 and to corresponding bond pads of the conductive pattern of the substrate 12. Though not shown in FIG. 3, the CPV module 10 may also include other electronic components such as a packaged diode or a rectifier which is/are attached to the first surface 14 of the substrate 12 and electrically connected to the conductive pattern thereof. Though also not shown, it is contemplated that thin metal foils or braided ribbon/mesh connectors may be used as an alternative to the wires 28 as a means for facilitating the electrical connection of the receiver die 20 to the conductive pattern disposed on the first surface 14 of the substrate 12.

The CPV module 10 further comprises a light guide 30 which is attached to the substrate 12. More particularly, the light guide 30 includes a generally quadrangular (e.g., square) base portion 32 and a hollow light funnel portion 34 which is integrally connected to and protrudes from the base portion 32. When viewed from the perspective shown in FIG. 3, the base portion 32 includes a top wall 36 and a side wall 38 which is integrally connected to and extends generally perpendicularly from the peripheral edge of the top wall 36. The top wall 36 of the base portion 32 is not continuous, but rather includes a generally quadrangular (e.g., square) opening within the approximate center thereof. In the CPV module 10, the distal edge of the side wall 38 is secured to the peripheral portion of the first surface 14 of the substrate 12 in the manner shown in FIG. 3. In this regard, as most apparent from FIG. 1, the length and width dimensions of the substrate 12 and base portion 32 are such that when the side wall 38 is secured to the first surface 14 of the substrate 12 in the aforementioned manner, the outer surface of the side wall 38 is substantially flush or continuous with the side surface 18 of the substrate 12, i.e., the four generally planar outer surface sections of the side wall 18 are substantially flush or continuous with respective ones of the four generally linear peripheral side surface segments of the side surface 18. Though not shown, it is contemplated that the substrate 12 and/or the light guide 30 may be provided with alignment features which facilitate a proper registry or alignment therebetween during the process of attaching the light guide 30 to the substrate 12.

As is also apparent from FIG. 3, when the base portion 32 of the light guide 30 is attached to the substrate 12 in the aforementioned manner, a gap 40 is defined between the top wall 36 and the first surface 14 of the substrate 12. As will be recognized, the width of the gap 40 between the inner surface of the top wall 36 and the first surface 14 is substantially equal to the height if of the side wall 38. Further, the orientation of the light guide 30 relative to the receiver die 20 is such that the generally quadrangular opening defined within the top wall 36 of the base portion 32 is substantially aligned with the generally quadrangular receiver die 20, and in particular the front surface 22 thereof in a manner best shown in FIGS. 2 and 3. In this regard, the four generally linear peripheral edge segments defined by the opening in the top wall 36 of the base portion 32 are substantially flush or continuous with respective ones of the four generally linear peripheral side surface segments of the side surface 26.

In the light guide 30, the funnel portion 34 is integrally connected to the base portion 32 so as to extend about or circumvent and protrude from the opening within the top wall 36. The hollow interior of the funnel portion 34 also communicates with the gap 40. As best seen in FIG. 1, the funnel portion 34 includes a first (lower) section 42 which is integrally connected to the top wall 36 of the base portion 32, and has a generally quadrangular (e.g., square) cross-sectional configuration. The first section 42 transitions to a second (upper) section 44 which has a generally circular cross-sectional configuration, and defines a distal rim 46 of the funnel portion 34. The length and width dimensions of the first section 42 at the location wherein it is integrally connected to the top wall 36 of the base portion 32 are preferably substantially equal to the length and width dimensions of the receiver die 20, with the four generally linear peripheral edge segments defined by the first section 42 at the point wherein it is integrally connected to the top wall 36 also being substantially aligned with respective ones of the four generally linear peripheral side surface segments of the side surface 26 of the receiver die 20. In the light guide 30, the first and second sections 42, 44 collectively define an inner surface 48 of the funnel portion 34 which extends from the distal rim 46 to the gap 40.

In the light guide 30, it is contemplated that the base and funnel portions 32, 34, or at least the funnel portion 34, may be fabricated or molded from a highly reflective material, e.g., a highly reflective polymer or silicone material that can be molded in high volume and with good accuracy. As a potential alternative, it is also contemplated that the funnel portion 34 may be fabricated from a non-reflective material, with inner surface 48 of the funnel portion 34 having a highly reflective coating applied thereto. More particularly, it is contemplated that this highly reflective coating may take the form of a thin reflective film which is plated upon the entirety of the inner surface 48 of the funnel portion 34, the film thus defining a reflective internal surface of the funnel portion 34.

As will be recognized, the reflective internal surface of the funnel portion 34 created by the material from which the funnel portion 34 is fabricated or the application of the reflective film to the inner surface 48 thereof is operative to guide focused solar rays to the front surface 22 of the receiver die 20 which, as indicated above, is aligned with the first section 42 of the funnel portion 34. The gradual shape transformation of the funnel portion 34 from the generally circular second section 44 to the generally quadrangular or square first section 42 and ultimately to the quadrangular or square end of the first section 42 integrally connected to the top wall 36 of the base portion 32 resolves the above-described geometry mismatch between a circular focused spot shape and a square-faced prism which further improves the light gathering efficiency of the light guide 30. In addition, the use of the light guide 30 including the hollow funnel portion 34 as an alternative to the use of the aforementioned solid glass prism of the prior art eliminates internal absorption loss in the CPV module 10 since solar rays channeled through the funnel portion 34 to the front surface 22 of the receiver die 20 do not go through interfaces between different materials such as the above-described optical adhesive materials used to attach the prism to the receiver die in prior art CPV modules. As a result, reflective (Fresnel) loss is averted in the CPV module 10 as a result of the inclusion of the light guide 30 therein. As indicated above, the gradual transform from a circular top end to a square bottom end in the funnel portion 34 of the light guide 30 resolves the geometry mismatch problems associated with square-faced prisms used in prior art CPV modules.

In the CPV module 10, the wires 28 used to electrically connect the receiver die 20 to the conductive pattern of the substrate 12 are effectively covered or shielded by a light guide 30, and reside within the gap 40 between the light guide 30 and substrate 12 in the manner shown in FIG. 3. Though not depicted in FIG. 3, it is contemplated that in the CPV module 10, portions of the gap 40 may be filled with a suitable filler material which encapsulates and effectively provides a further measure of protection to the wires 28, but does not flow over or onto that portion of the front surface 22 of the receiver die 20 which extends between the bus bars and receives solar rays channeled thereto from through the funnel portion 34 of the light guide 30.

Figure 4:
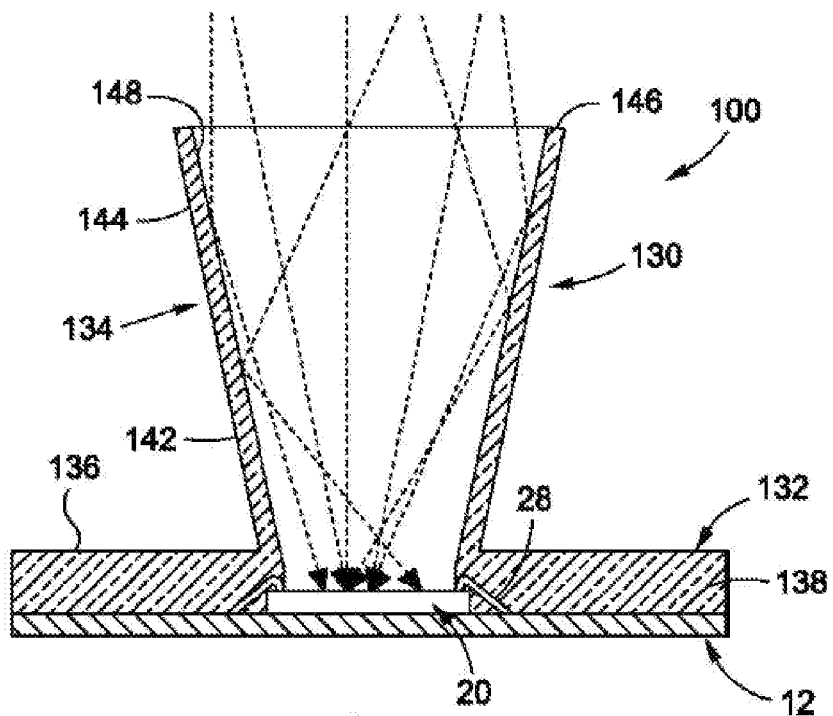
FIG. 4 is a cross-sectional view similar to FIG. 3 but depicting a CPV module constructed in accordance with a second embodiment of the present invention.

Referring now to FIG. 4, there is shown a CPV module 100 which is constructed in accordance with a second embodiment of the present invention. The CPV module 100 includes the substrate 12, receiver die 20 and wires 28 which have the same structural features and are operatively connected to each other in the same manner as described above in relation to the CPV module 10. Thus, the distinction between the CPV modules 10, 100 lies in the configuration of the light guide 130 included in the CPV module 100 in comparison to the light guide 30 included in the CPV module 100. The structural differences between the light guides 130, 30 will be described below.

In the CPV module 100, the light guide 130 which is attached to the substrate 12 includes a generally quadrangular (e.g., square) base portion 132 and a hollow light funnel portion 134 which is integrally connected to and protrudes from the base portion 132. As shown in FIG. 4, the light guide 130 is molded onto the substrate 12 in manner wherein the base portion 132 covers the exposed portion of the first surface 14, and encapsulates both the peripheral portion of the receiver die 20 and the wires 28 used to electrically connect the same to the conductive pattern of the substrate 12. When viewed from the perspective shown in FIG. 4, the fully molded base portion 132 of the light guide 130 defines a top surface 136 and a side surface 138 which extends generally perpendicularly relative to the top surface 136. The base portion 132 also includes a generally quadrangular (e.g., square) opening within the approximate center of the top surface 136 thereof. In the CPV module 100, the length and width dimensions of the substrate 12 and base portion 132 are such that when the light guide is molded onto the substrate 12 in the aforementioned manner, the side surface 38 of the base portion 132 is substantially flush or continuous with the side surface 18 of the substrate 12, i.e., the four generally planar side surface sections of the side surface 132 are substantially flush or continuous with respective ones of the four generally linear peripheral side surface segments of the side surface 18. Though not shown, it is contemplated that the substrate 12 and/or the light guide 130 may be provided with alignment features which facilitate a proper registry or alignment therebetween during the process of molding the light guide 130 onto the substrate 12.

As is also apparent from FIG. 4, the light guide 130 is molded onto the substrate 12 in a manner wherein the orientation of the light guide 130 relative to the receiver die 20 is such that the generally quadrangular opening defined within the base portion 132 is substantially aligned with the generally quadrangular receiver die 20, and in particular the front surface 22 thereof. As such, that portion of the front surface 22 of the receiver die 28 other than for the periphery thereof which is overmolded by the base portion 132 is exposed within the opening of the base portion 132. Along these lines, the four generally linear peripheral edge segments defined by the opening of the base portion 32 are generally aligned with respective ones of the four generally linear peripheral side surface segments of the side surface 26 of the receiver die 20.

In the light guide 130, the funnel portion 134 is integrally connected to the base portion 132 so as to extend about or circumvent and protrude from the opening within the base portion 132. Like the funnel portion 34 of the light guide 30, the funnel portion 134 includes a first (lower) section 142 which is integrally connected to the base portion 132, and has a generally quadrangular (e.g., square) cross-sectional configuration. The first section 142 transitions to a second (upper) section 144 which has a generally circular cross-sectional configuration, and defines a distal rim 146 of the funnel portion 134. The length and width dimensions of the first section 142 at the location wherein it is integrally connected to the base portion 132 are preferably substantially equal to the length and width dimensions of the receiver die 20, with the four generally linear peripheral edge segments defined by the first section 142 at the point wherein it is integrally connected to the base portion 132 also being substantially aligned with respective ones of the four generally linear peripheral side surface segments of the side surface 26 of the receiver die 20. In the light guide 130, the first and second sections 142, 144 collectively define an inner surface 148 of the funnel portion 34 which extends from the distal rim 146 to the receiver die 20.

In the light guide 130, it is contemplated that the base and funnel portions 132, 134, or at least the funnel portion 134, may be fabricated or molded from a highly reflective material, e.g., a highly reflective polymer or silicone material that can be molded in high volume and with good accuracy. As a potential alternative, it is also contemplated that the funnel portion 134 may be fabricated from a non-reflective material, with inner surface 148 of the funnel portion 134 having a highly reflective coating applied thereto. More particularly, it is contemplated that this highly reflective coating may take the form of a thin reflective film which is plated upon the entirety of the inner surface 148 of the funnel portion 134, the film thus defining a reflective internal surface of the funnel portion 134.

As will be recognized, the reflective internal surface of the funnel portion 134 created by the material from which the funnel portion 134 is fabricated or the application of the reflective film to the inner surface 148 thereof is operative to guide focused solar rays to the front surface 22 of the receiver die 20 which, as indicated above, is aligned with the first section 142 of the funnel portion 134. The gradual shape transformation of the funnel portion 134 from the generally circular second section 144 to the generally quadrangular or square first section 142 and ultimately to the quadrangular or square end of the first section 142 integrally connected to the base portion 132 provided the same advantages described above in relation to the light guide 30.

Figure 5:
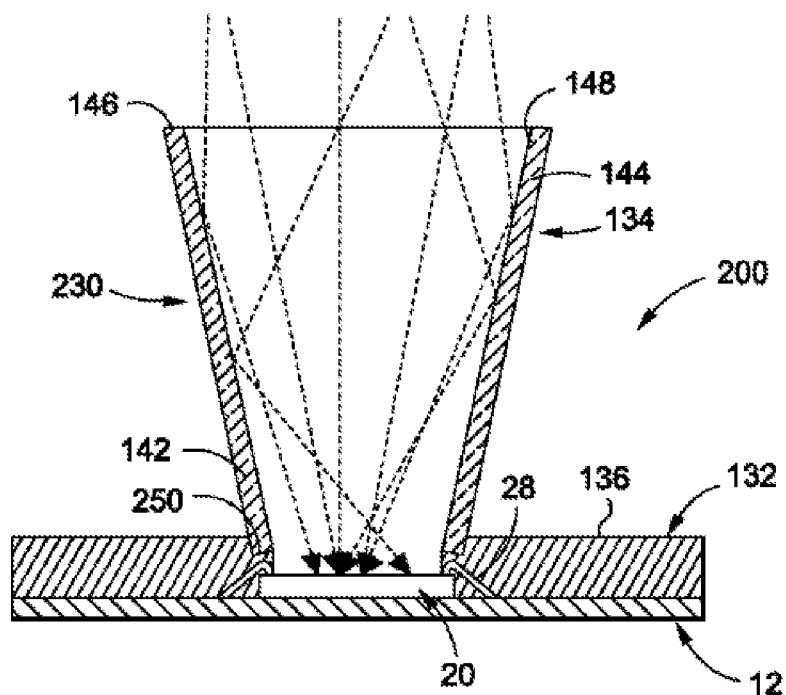
FIG. 5 is a cross-sectional view similar to FIG. 3 but depicting a CPV module constructed in accordance with a third embodiment of the present invention.

Referring now to FIG. 5, there is shown a CPV module 200 constructed in accordance with a third embodiment of the present invention. The CPV module 200 also includes the substrate 12, receiver die 20 and wires 28 which have the same structural features and are operatively connected to each other in the same manner as described above in relation to the CPV module 10. In this regard, the CPV module 200 bears substantial similarity to the above-described CPV module 100, with only the distinctions between the CPV modules 200, 100 described below.

More particularly, the sole distinction between the CPV modules 200, 100 lies in the base portion 132 and funnel portion 134 of the light guide 230 included in the CPV module 200 being separate and distinct elements which are attached to each other, rather than being integrally connected to each other as are the base portion 132 and funnel portion 134 of the light guide 130 included on the CPV module 100. In this regard, to accommodate the funnel portion 134, the base portion 132 of the light guide 230 is formed to define a shoulder 250 which is recessed relative to the top surface 136 thereof, and fully or at least partially circumvents the generally quadrangular or square opening formed in the base portion 136. As seen in FIG. 5, the attachment of the funnel portion 134 to the base portion 132 is facilitated by abutting that end of the funnel portion 134 defined by the first section 142 thereof (which is opposite the distal rim 146 defined by the second section 144) against the shoulder 250. It is contemplated that in the light guide 230, the funnel portion 134 may be operatively secured to the base portion 132 through the use of a suitable adhesive.

Figure 6:
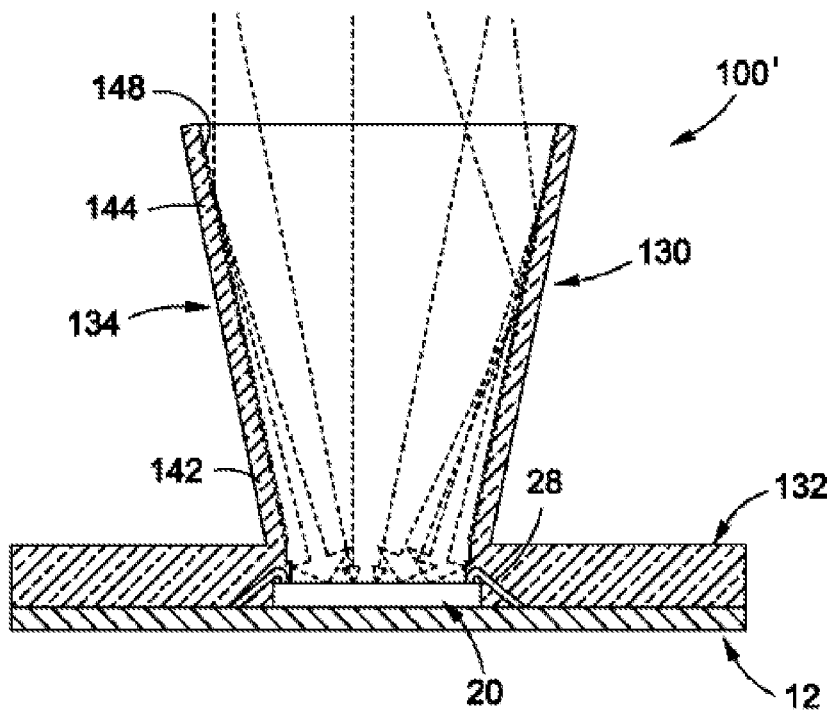
FIG. 6 is a cross-sectional view similar to FIG. 3 but depicting a potential variant of the CPV modules shown in FIGS. 3-5.

Referring now to FIG. 6, there is shown a CPV module 100' which comprises a variant of the CPV module 100 shown in FIG. 4 and described above. The sole distinction between the CPV modules 100, 100' lies in the reflective internal surface of the funnel portion 134 of the light guide 130 being textured in a prescribed manner to spread the reflected rays for more even distribution onto the front surface 22 of the receiver die 20. As will be recognized by those of ordinary skill in the art, if the funnel portion 134 is fabricated in its entirety from a highly reflective material, the texturing will be applied to the inner surface 148 collectively defined by the first and second sections 142, 144 of the funnel portion 134. If, on the other hand, the reflective internal surface of the funnel portion 134 is defined by the reflective film plated onto the inner surface 148, such film may itself be textured to provide for the spreading of the reflective solar rays in a prescribed manner. It is contemplated that such texturing may be facilitated by machining, etching, sand blasting, or other suitable texturing methods. Additionally, those of ordinary skill in the art will recognize that the option of texturing the internal reflective surface of the funnel portion 134 of the light guide 130 as described in relation to the CPV module 100' may also be applied to the internal reflective surfaces of the funnel portions 34, 134 of the light guides 30, 230.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A CPV module, comprising:
a substrate including a conductive pattern;
a receiver die mounted to the substrate and electrically connected to the conductive pattern; and
a light guide attached to the substrate and including a base portion that covers at least a portion of the substrate, wherein the base portion includes a horizontal top wall disposed above the receiver die and a side wall extending from the top wall to the substrate, and a hollow funnel portion joining the horizontal top wall of the base portion disposed inward from the side wall and at an acute angle, wherein the horizontal top wall extends laterally outward with respect to a central axis of the hollow funnel portion and extends laterally outside of a widest dimension of the hollow funnel portion, and wherein the base portion and the hollow funnel portion are a single integrated structure comprising a molded reflective material, and wherein the hollow funnel portion is configured to focus solar rays onto the receiver die, and wherein the hollow funnel portion includes a first section that extends from the base portion and transitions to a second section that defines a distal rim, the first section having a quadrangular cross-sectional configuration and the second section having a circular cross-sectional configuration, and wherein the first section has increasing length and width dimensions from an opening in the horizontal top wall to the second section, and the second section has an increasing diameter from the first section to the distal rim.

2. The CPV module of claim 1, wherein the length and width dimensions of the first section where the first section meets the base portion are equal to the length and width dimensions of the receiver die.

3. The CPV module of claim 1 wherein the receiver die is electrically connected to the conductive pattern by bond wires which are at least partially shielded by the base portion of the light guide.

4. The CPV module of claim 1 wherein the receiver die is electrically connected to the conductive pattern by bond wires, and wherein the base portion physically contacts the bond wires.

5. The CPV module of claim 4, wherein the base portion defines an opening which is aligned with the receiver die, and the hollow funnel portion is in alignment with the opening.

6. The CPV module of claim 1 wherein a distal edge of the side wall is secured to a peripheral portion of the substrate.

7. The CPV module of claim 1 wherein the base portion is in physical contact with a peripheral portion of the receiver die.

8. The CPV module of claim 1 wherein the first and second sections collectively define an inner surface of the hollow funnel portion which is textured to spread reflected solar rays in a prescribed manner.

9. A CPV module, comprising:
a substrate including a conductive pattern;
a receiver die mounted to the substrate;
a means for electrically connecting the receiver die to the conductive pattern; and a light guide attached to the substrate and including:
a base portion that at least partially covers the substrate and the electrical connection means, wherein the base portion includes a horizontal top wall disposed above the receiver die and having an opening therein, a side wall extending from the top wall to the substrate, and a recessed portion defining a shoulder that adjoins the opening at the horizontal top wall and is spaced apart from the receiver die; and
a hollow funnel portion abutting the shoulder and joining the top surface of the base portion disposed inward from the side wall and at an acute angle, wherein the horizontal top wall extends laterally outward with respect to a central axis of the hollow funnel portion and extends laterally outside of a widest dimension of the hollow funnel portion, and wherein the hollow funnel portion overlies the receiver die and is sized and configured to focus solar rays onto the receiver die, the hollow funnel portion including a first section that extends from the base portion, and transitions to a second section that defines a distal rim, the first section having a square cross-sectional configuration and the second section having a circular cross-sectional configuration, wherein the first section has increasing length and width dimensions from the base portion to the second section, and wherein the second section has an increasing diameter from the first section to the distal rim.

10. The CPV module of claim 9 wherein the base portion is in physical contact with the electrical connection means.

11. The CPV module of claim 9, wherein the base portion is in physical contact with a peripheral portion of the receiver die.

12. A CPV module, comprising:
a substrate;
a receiver die mounted to the substrate; and
a light guide attached to the substrate and including:
a base portion that covers portions of the substrate and contacts peripheral portions of the receiver die, wherein the base portion includes a horizontal top wall disposed above the receiver die, a side wall extending towards the substrate and an opening that overlies the receiver die; and
a hollow funnel portion joining the top wall of the base portion disposed inward from the side wall and at an acute angle to a top surface of the horizontal top wall, and wherein the hollow funnel portion protrudes outward from the top wall and is sized and configured to focus solar rays onto the receiver die, and wherein the base portion and the hollow funnel portion are a single integrated structure comprising a molded reflective material, and wherein the horizontal top wall extends laterally outward with respect to a central axis of the hollow funnel portion and extends laterally outside of a widest dimension of the hollow funnel portion.

13. The CPV module of claim 12, wherein the base portion is in physical contact with a peripheral portion of the receiver die.

14. The CPV module of claim 12 further comprising a conductive connective structure electrically connecting the receiver die to the substrate.

15. The CPV module of claim 14, wherein the base portion is in physical contact with the conductive connective structure.

16. The CPV module of claim 12, wherein:
the hollow funnel portion includes a first section that extends from the base portion and transitions to a second section that defines a distal rim, the first section having a quadrangular cross-sectional configuration and the second section having a circular cross-sectional configuration; and
the first section has increasing length and width dimensions from the opening to the second section, and the second section has an increasing diameter from the first section to the distal rim.

* * * * *